(12) United States Patent
Plappert et al.

(10) Patent No.: US 8,618,639 B2
(45) Date of Patent: Dec. 31, 2013

(54) SEMICONDUCTOR STRUCTURE, SEMICONDUCTOR DEVICE HAVING A SEMICONDUCTOR STRUCTURE, AND METHOD FOR MANUFACTURING A SEMICONDUCTOR STRUCTURE

(75) Inventors: Mathias Plappert, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/472,949

(22) Filed: May 16, 2012

(65) Prior Publication Data
US 2013/0307031 A1 Nov. 21, 2013

(51) Int. Cl.
*H01L 29/04* (2006.01)

(52) U.S. Cl.
USPC ............ 257/627; 257/628; 257/E29.004; 257/E21.122; 257/E21.125; 438/406

(58) Field of Classification Search
USPC ............ 257/627, 628, E29.004, E21.122, 257/E21.125; 438/406
See application file for complete search history.

(56) References Cited

U.S. PATENT DOCUMENTS

2007/0117355 A1* 5/2007 Ueda et al. ............ 438/478
2012/0240987 A1* 9/2012 King et al. ............ 136/255

* cited by examiner

*Primary Examiner* — Tu-Tu Ho
(74) *Attorney, Agent, or Firm* — Murphy, Bilak & Homiller, PLLC

(57) ABSTRACT

According to an embodiment, a semiconductor structure includes a first monocrystalline semiconductor portion having a first lattice constant in a reference direction; a second monocrystalline semiconductor portion having a second lattice constant in the reference direction, which is different to the first lattice constant, on the first monocrystalline semiconductor portion; and a metal layer formed on and in contact with the second monocrystalline semiconductor portion.

10 Claims, 8 Drawing Sheets

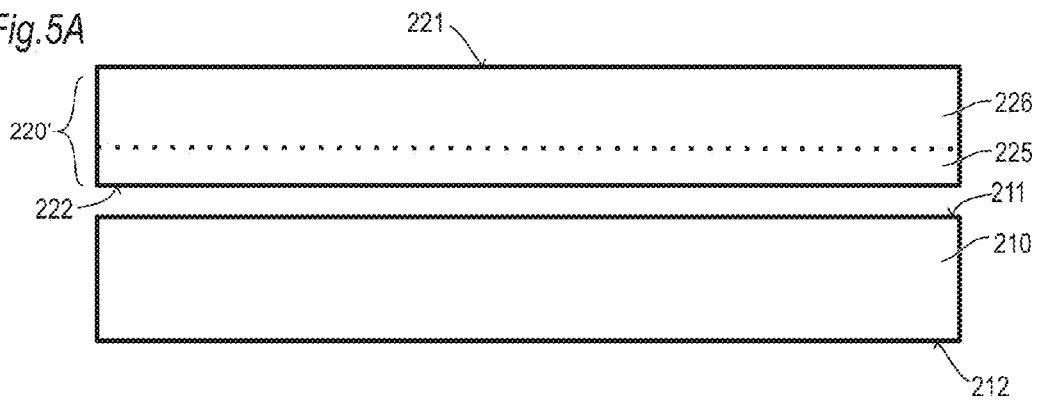
Fig.5A
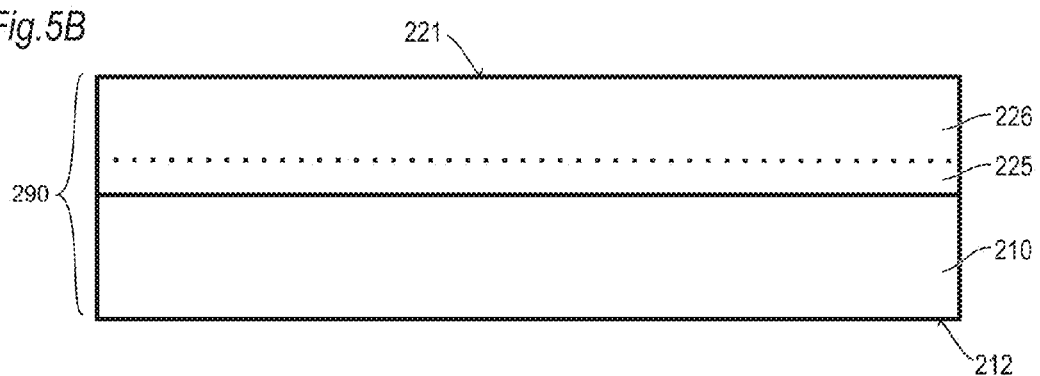
Fig.5B
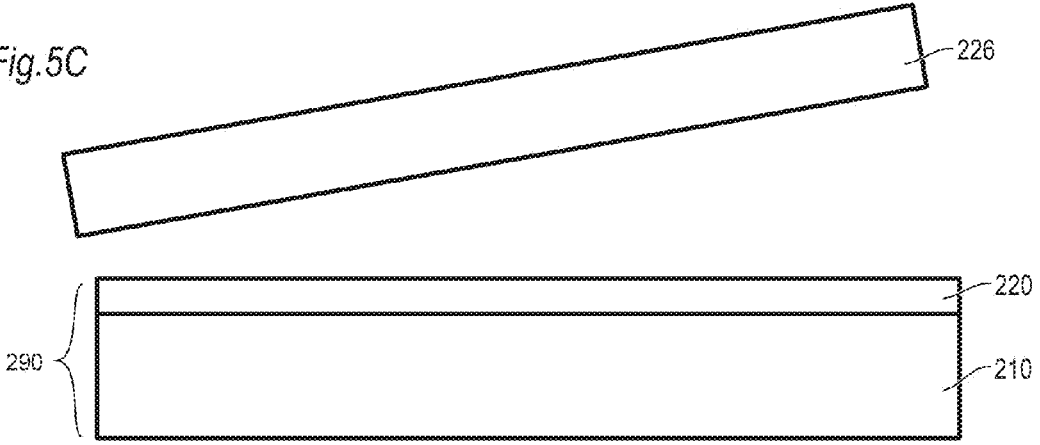
Fig.5C
Fig.5D
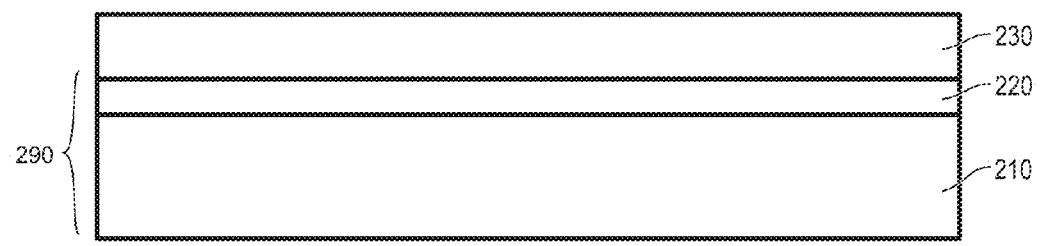

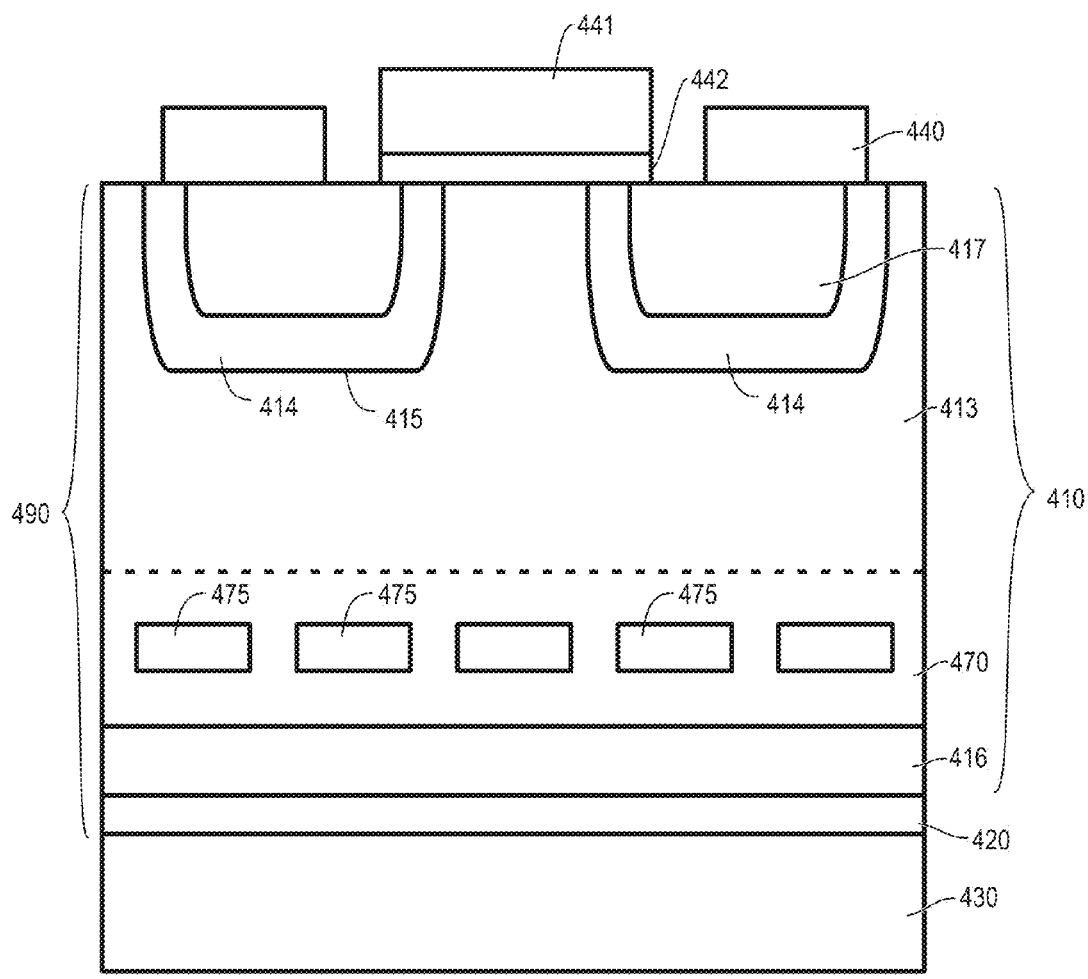

SEMICONDUCTOR STRUCTURE, SEMICONDUCTOR DEVICE HAVING A SEMICONDUCTOR STRUCTURE, AND METHOD FOR MANUFACTURING A SEMICONDUCTOR STRUCTURE

TECHNICAL FIELD

Embodiments described herein relate to semiconductor structures having homogeneously deep spikes between a semiconductor body and a metal layer, semiconductor devices with such semiconductor structures, and methods for manufacturing such semiconductor structures.

BACKGROUND

Semiconductor devices include doping regions which need to be contacted, usually by metal layers. In many applications, aluminium or an aluminium alloy is used for the metal layers due to the low ohmic resistance of aluminium and the good contact resistance to semiconductors. However, the interface between the aluminium metal layer and the semiconductor substrate is prone to the formation of spikes. Such spikes form during annealing which is typically carried out after deposition of the aluminium metal layer, for example in a temperature range between 350° C. and 450° C. Spikes formed and extending into the semiconductor substrate may cause current filaments which could destroy the semiconductor device. Furthermore, spikes extending rather deep into the semiconductor substrate may reach pn-junctions or doping regions so that short circuits are generated.

One attempt to reduce generation of spikes is to lower the annealing temperature. This is, however, only possible in limited cases. Another attempt is the formation of a barrier layer between the semiconductor substrate and the metal layer. Such a barrier layer needs to be defect-free to function as barrier layer. Otherwise the barrier layer even enhances spike generation. Furthermore, barrier layers may affect the contact resistance between the metal layer and the semiconductor substrate.

In view of the above, there is a need for improvement.

SUMMARY

According to an embodiment, a semiconductor structure includes a first monocrystalline semiconductor portion having a first lattice constant in a reference direction; a second monocrystalline semiconductor portion having a second lattice constant in the reference direction, which is different to the first lattice constant, on the first monocrystalline semiconductor portion; and a metal layer formed on and in contact with the second monocrystalline semiconductor portion.

According to an embodiment, a semiconductor device includes a semiconductor body including a first monocrystalline semiconductor portion having a first lattice constant in a reference direction; a second monocrystalline semiconductor portion having a second lattice constant in the reference direction, which is different to the first lattice constant, on the first monocrystalline semiconductor portion; and at least one pn-junction formed in the first monocrystalline semiconductor portion of the semiconductor body. The semiconductor device further includes a metal layer formed on and in ohmic contact with the second monocrystalline semiconductor portion.

According to an embodiment, a method for manufacturing a semiconductor structure includes providing a first monocrystalline semiconductor portion having a first lattice constant in a reference direction; forming a second monocrystalline semiconductor portion having a second lattice constant in the reference direction, which is different to the first lattice constant, on the first monocrystalline semiconductor portion; and forming a metal layer on and in contact with the second monocrystalline semiconductor portion.

According to an embodiment, a method for manufacturing a semiconductor body includes providing a first monocrystalline semiconductor wafer having a first lattice constant in a reference direction; providing a second monocrystalline semiconductor wafer having a second lattice constant in the reference direction, which is different to the first lattice constant; bonding the first monocrystalline semiconductor wafer to the second monocrystalline semiconductor wafer to form a semiconductor body comprising a first monocrystalline semiconductor portion having the first lattice constant in the reference direction and a second monocrystalline semiconductor portion having the second lattice constant in the reference direction; and forming a metal layer on and in contact with the second monocrystalline semiconductor portion.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 5A to 5D illustrate processes of a method for manufacturing a semiconductor structure having a controlled spike formation between a semiconductor body and a metal layer according to an embodiment;

FIG. 8 illustrates a semiconductor device with reduced spike formation between the semiconductor body and the metallisation according to another embodiment;

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Figure 1A:
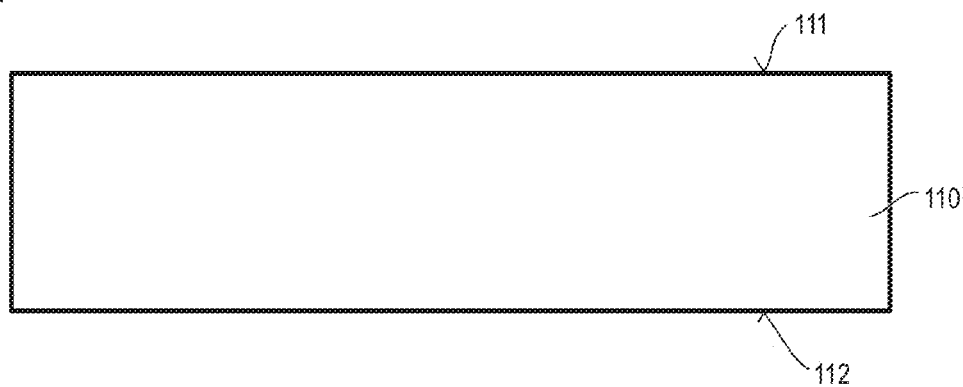
FIGS. 1A to 1C illustrate processes of a method for manufacturing a semiconductor structure having a controlled spike formation between a semiconductor body and a metal layer according to an embodiment.

With reference to FIG. 1, a first embodiment of a semiconductor structure is described. A first semiconductor substrate 110, which forms a first monocrystalline semiconductor portion, is provided. The first semiconductor substrate 110 includes a first surface 111 and a second surface 112 opposite to the first surface 111. The first semiconductor substrate 110 forming the first monocrystalline semiconductor portion is comprised of a monocrystalline semiconductor material having a first lattice constant in a reference direction. According to an embodiment, the monocrystalline semiconductor material is comprised of monocrystalline silicon having a <100> lattice structure, wherein the notation <100> describe the Miller indices of a cubic crystal lattice. The reference direction can be, for example, the normal of the first surface 111.

The monocrystalline semiconductor material can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaP) or indium gallium arsenide phosphide (InGaAsP), and binary or ternary II-VI semiconductor materials such as cadmium telluride (CdTe) and mercury cadmium telluride (HgCdTe) to name a few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide (Si—SiC) and SiGe graded heterojunction semiconductor material. For power semiconductor applications currently mainly Si, SiC and Si—SiC materials are used.

Figure 1B:
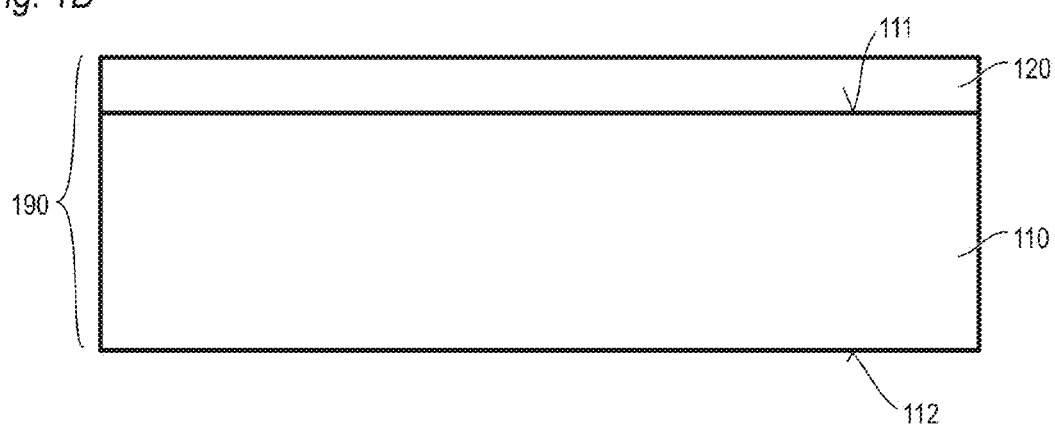

In a further process, a second semiconductor substrate 120, which forms here a second monocrystalline semiconductor portion, is formed on the first surface 111 of the first semiconductor substrate 110 as illustrated in FIG. 1B. The second monocrystalline semiconductor portion 120 can be formed using different processes such as deposition, sputtering, wafer bonding including so-called smart cut processes as described further below, etc. According to an embodiment, the second monocrystalline semiconductor portion 120 is in direct contact with the first monocrystalline semiconductor portion 110.

The second monocrystalline semiconductor portion 120 has a second lattice constant in the reference direction, which is different to the first lattice constant of the first monocrystalline semiconductor portion 110. According to an embodiment, the second monocrystalline semiconductor portion 120 is comprised of monocrystalline silicon and has a <111> lattice orientation, wherein the notation <111> again describes the Miller indices of a cubic crystal lattice. According to an embodiment, the second monocrystalline semiconductor portion 120 has a thickness between about 0.5 µm and about 5 µm.

According to an embodiment, the first monocrystalline semiconductor portion and the second monocrystalline semiconductor portion are made of the same semiconductor material such as silicon as described above and form together a semiconductor body 190, for example of a bipolar or a unipolar semiconductor device as described further below.

Figure 1C:
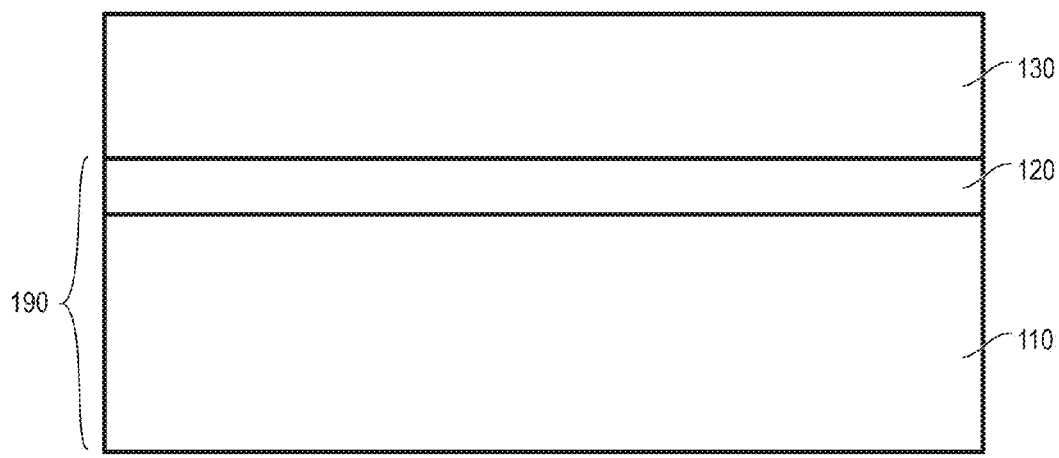

In a further process, as illustrated in FIG. 1C, a metal layer 130 is formed on and in contact with the second monocrystalline semiconductor portion 120. The metal layer 130 can be comprised of a single metal layer, a metal alloy layer, or a combination thereof. For example, the metal layer 130 can include at least aluminium or an aluminium alloy. The metal layer 130 can be deposited, for example by sputtering or chemical vapour deposition. Finally, an optional annealing process is carried out at an elevated temperature.

As illustrated in FIG. 1C, a semiconductor structure is formed which includes a first monocrystalline semiconductor portion 110 having a first lattice constant in a reference direction; a second monocrystalline semiconductor portion 120 having a second lattice constant in the reference direction, which is different to the first lattice constant, on the first monocrystalline semiconductor portion 110; and a metal layer 130 formed on and in contact with the second monocrystalline semiconductor portion 120. The metal layer 130 typically forms an ohmic contact with the second monocrystalline semiconductor portion 120.

As described above, the second monocrystalline semiconductor portion 120, i.e. the <111> monocrystalline silicon material in the above described embodiment, is arranged between the first monocrystalline semiconductor portion 110, i.e. the <100> monocrystalline silicon material in the above described embodiment, and the metal layer 130, and is, according to an embodiment, in direct contact with the first monocrystalline semiconductor portion 110 and the metal layer 130.

The second monocrystalline semiconductor portion 120 having a different lattice orientation than the first monocrystalline semiconductor portion 110 provides for a controlled formation of spikes when the metal layer 130 is annealed. For example, a silicon layer or portion having a <111> orientation shows, in comparison to a <100> silicon layer or portion, spike formation with less deeply formed spikes so that the depth of the spikes is more uniform than at a <100> silicon layer. This has been experimentally confirmed using scanning electron microscopy (SEM) after wet-chemical removal of aluminium.

Figure 9A:
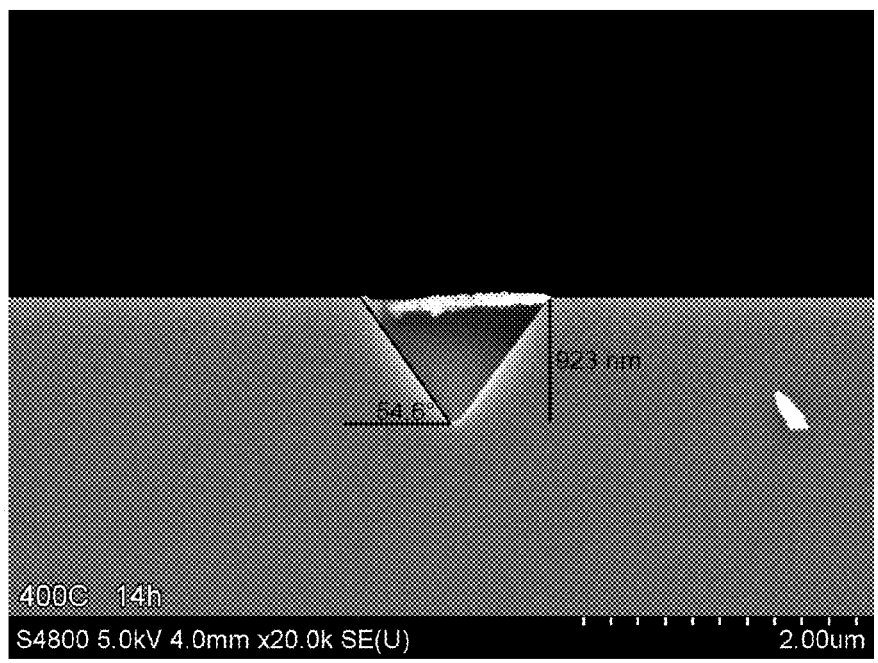
FIGS. 9A and 9B illustrate SEM micrographs of a cross-section and the surface of a <100> silicon material showing spike formation after wet-chemically removal of aluminium.

FIG. 9A shows an SEM micrograph of a vertical cross-section with respect to the surface of a monocrystalline silicon material having a <100> lattice orientation on the surface. The <100> monocrystalline silicon material has been cut and polished so that a spike hole is exposed. The term 'spike' as used herein refers to a protrusion formed by an aluminium layer disposed on the surface of the <100> monocrystalline silicon material. Such protrusions extend into the <100> monocrystalline silicon material. Since the aluminium layer has been wet-chemically removed before taking the SEM micrograph, it is not shown in FIG. 9A. The removed protrusions leave spike holes in the surface of the <100> monocrystalline silicon material as visible in FIGS. 9A and 9B.

Figure 9B:
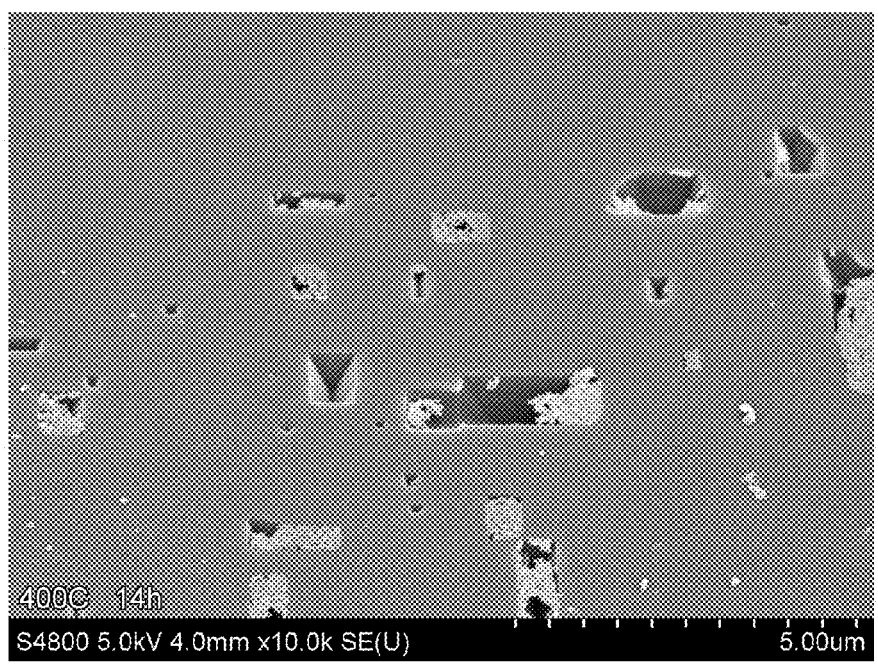

As can be gathered from FIG. 9A, the spike holes can have a depth of nearly 1 μm with inclined side walls close to the typical angle of 54.7°. FIG. 9B shows an oblique view onto the surface of the same <100> monocrystalline silicon material from which the aluminium layer has been removed before the micrograph was taken. Aluminium residues partially remain in the spike holes. FIGS. 9A and 9B have been taken after a thermal anneal of 14 h at about 400° C.

Figure 10A:
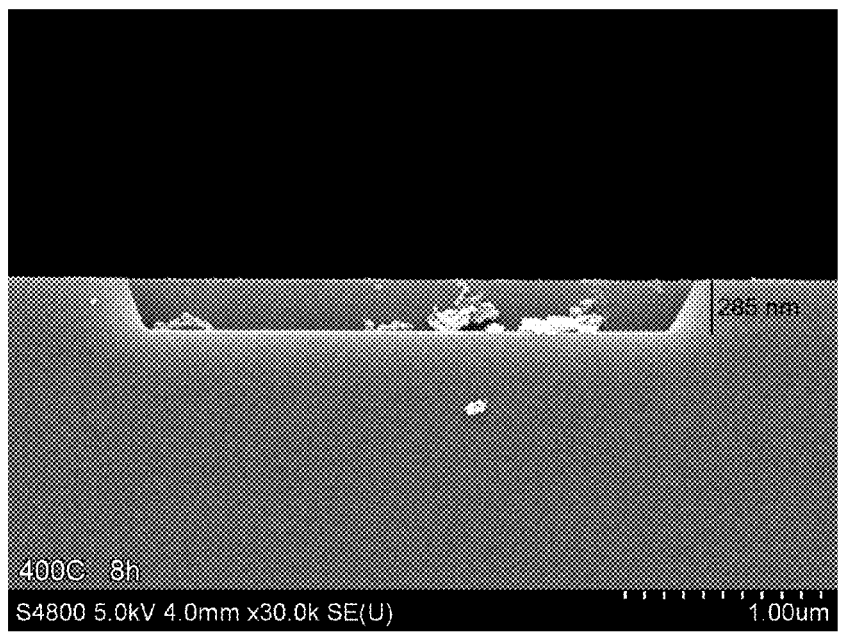
FIGS. 10A and 10B illustrate SEM micrographs of a cross-section and the surface of a <111> silicon material showing spike formation after wet-chemically removal of aluminium.
Figure 10B:
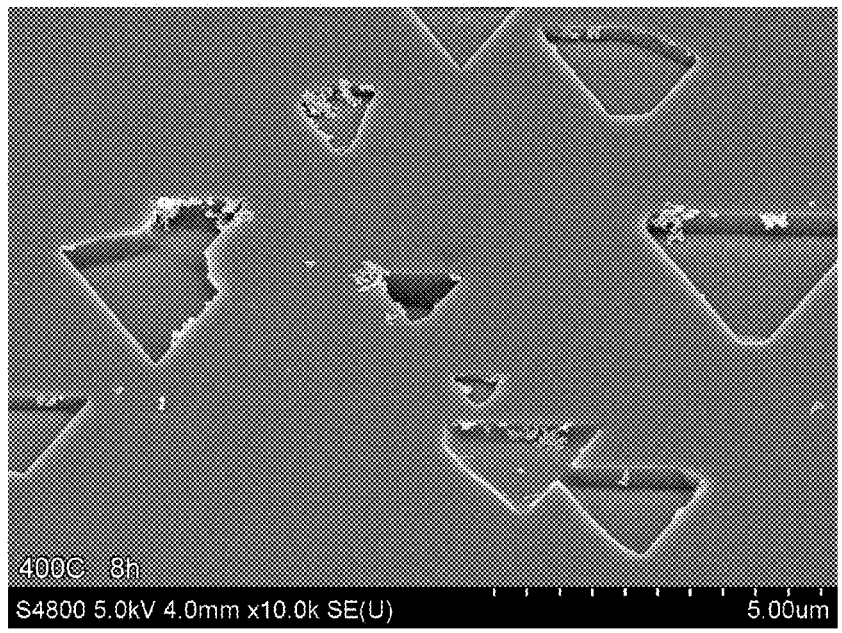

Different to FIGS. 9A and 9B, FIGS. 10A and 10B illustrate the situation for a <111> monocrystalline silicon material after an 8 h anneal at 400° C. FIG. 10A shows a SEM micrograph of vertical cross-section perpendicular to the surface of the <111> monocrystalline silicon material while FIG. 10B shows an oblique view onto the surface of the same <111> monocrystalline silicon material. Again, the aluminium layer has been removed by wet-chemical etching. As revealed by SEM, the spike holes have a significantly reduced depth, in the present example of about 285 nm, in comparison to the <100> monocrystalline silicon material of FIG. 9A, but they appear to be wider than on the <100> monocrystalline silicon material.

Without wishing to be tied by theory, this difference is believed to be a result of the different diffusion characteristics of silicon into aluminium. At a <100> surface, silicon can readily diffuse, particularly when activated by a thermal anneal, into aluminium allowing the aluminium to grow into the depth of silicon and to form the spikes. Since the diffusion characteristics strongly depend on the lattice orientation, the sidewalls having the characteristic angle of 54.7° are formed.

At a <111> surface, the diffusion is limited and hence the formation of deep spike holes restricted. However, when silicon diffuses into aluminium, small holes or voids are generated which have at their sidewalls a <100> orientation. At these sidewalls, as explained above, a significantly higher diffusion of silicon occurs so that the voids or small holes growth faster laterally than vertically. As a result, shallow but wide voids or spike holes are formed at a <111> surface.

For semiconductor devices, this is beneficial since deep spike holes can be avoided and hence the growth of aluminium into the depth of the monocrystalline silicon material is limited. This allows formation of pn-junctions and/or of buried doping regions at a lower depth in comparison to devices having a metal layer in direct contact with <100> monocrystalline silicon material. Furthermore, the wide spike holes provide for a more even contact formation between the metal layer and the monocrystalline silicon material so that the risk of current filamentation is reduced.

Figure 2:
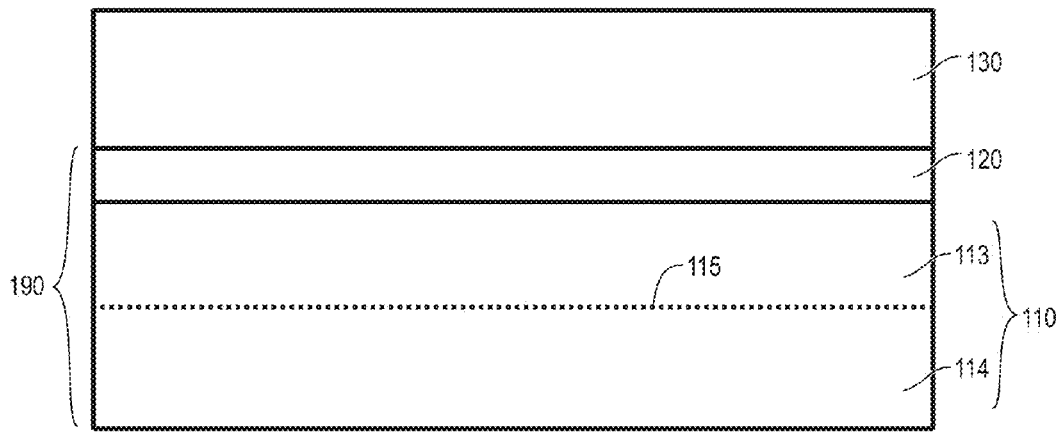
FIG. 2 illustrates a semiconductor structure according to an embodiment.

The above described semiconductor structure, or metallization contact structure using a second monocrystalline semiconductor portion having a different lattice orientation than the first monocrystalline semiconductor portion, is particularly useful for semiconductor devices having at least two doping regions arranged in the first monocrystalline semiconductor portion and forming a pn-junction therein. FIG. 2 show for example a semiconductor device having a semiconductor body 190 with the first monocrystalline semiconductor portion 110 and the second monocrystalline semiconductor portion 120 in direct contact with each other. A first doping region 113 of a first conductivity type and a second doping region 114 of a second conductivity type are formed in the first monocrystalline semiconductor portion 110, which form a pn-junction 115 at a given distance from the second monocrystalline semiconductor portion 120. The second monocrystalline semiconductor portion 120 is in this embodiment of the same conductivity type as the first doping region 113, i.e. of the first conductivity type. According to an embodiment, the first doping region 113 and the second monocrystalline semiconductor portion 120 are in direct contact with each other and have the same doping concentration to avoid or reduce formation of electrical interfaces. It would also be possible to provide the first doping region 113 and the second monocrystalline semiconductor portion 120 with different doping concentrations. Since the second monocrystalline semiconductor portion 120 is in direct contact with the metal layer 130, a sufficiently high doping concentration is desirable to improve the ohmic contact between the second monocrystalline semiconductor portion 120 and the metal layer 130.

Figure 3:
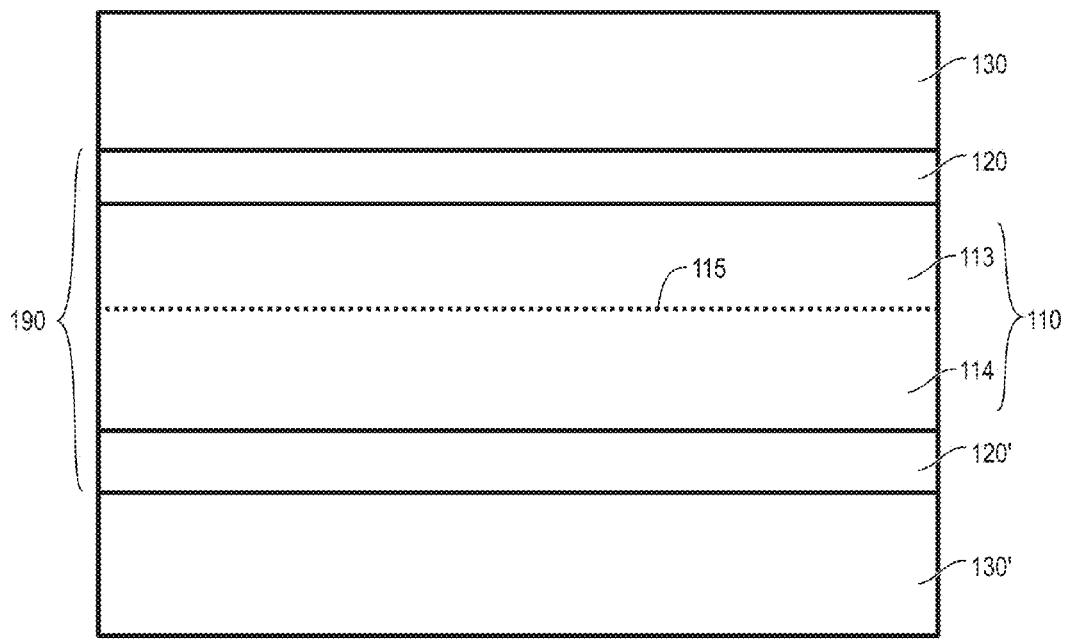
FIG. 3 illustrates a semiconductor structure according to an embodiment.

FIG. 3 illustrates an embodiment which is similar to the one of FIG. 2, but with metal layers 130, 130' on opposite surfaces of the semiconductor body 190. In this embodiment, a second monocrystalline semiconductor portion 120' is formed on and in contact with the second doping region 114 of the semiconductor body 190 and of the same conductivity type as the second doping region 114. Both second monocrystalline semiconductor portions 120, 120' disposed on and in contact with the respective opposing surfaces of the semiconductor body 190 are provided to establish low ohmic contacts between the respective doping regions (first and second doping regions 113, 114) and the respective metal layers 130, 130'.

As described above in connection with FIGS. 1A to 1C, the semiconductor structure having the first and second monocrystalline semiconductor portion can be formed by providing a first monocrystalline semiconductor portion 110 having a first lattice constant in a reference direction; forming a second monocrystalline semiconductor portion 120 having a second lattice constant in the reference direction, which is different to the first lattice constant, on the first monocrystalline semiconductor portion 110; and forming a metal layer 130 on and in contact with the second monocrystalline semiconductor portion 120.

According to an embodiment, the second monocrystalline semiconductor portion 120 can be formed by forming a semiconductor layer 120, selected from the group consisting of micro-crystalline semiconductor layer, partially micro-crystalline semiconductor layer, amorphous semiconductor layer and partially amorphous semiconductor layer, on the first monocrystalline semiconductor portion 110; and annealing the semiconductor layer 120 at an elevated temperature to cause the semiconductor layer 120 to crystallise or to re-crystallise to form the second monocrystalline semiconductor portion 120 on and in contact with the first monocrystalline semiconductor portion 110. The annealing can be carried out at a temperature equal to or higher than 800° C., for example in a temperature range between about 800° C. and about 1250° C. According to an embodiment, the annealing is carried out at a temperature in a range between about 1100° C. and about 1200° C. At these temperatures, the semiconductor layer 120 re-crystallises and forms the second monocrystalline semiconductor portion 120 having a different lattice orientation than the first monocrystalline semiconductor portion 110.

The above describes processes are cost efficient and do not require additional equipment.

Within the framework of this description, the term 'microcrystalline' describes a polycrystalline structure having crystals in a range from about 10 nm to about 100 μm, and particularly in a range from about 100 nm to about 30 μm. Different thereto, an amorphous layer includes crystals which are smaller than 10 nm.

The semiconductor layer 120 can be formed by depositing semiconductor material by sputtering or evaporation processes, or by chemical vapour deposition.

According to an embodiment, the formation of the semiconductor layer 120 includes irradiating a surface, for example the first surface 111 of the first monocrystalline semiconductor portion 110 with low-energy particles to convert at least a section or part of the first monocrystalline semiconductor portion 110 into a semiconductor layer 120, which is partially or completely micro-crystalline or amorphous. Suitable low-energy particles are for example hydrogen ions which are irradiated by subjecting the first monocrystalline semiconductor portion 110 to hydrogen plasma. The low-energy particles partially evaporate semiconductor material from the irradiated surface of the first monocrystalline semiconductor portion 110. The evaporated material re-deposits on the surface. The depth of and extent to which the re-deposited material is amorphous or micro-crystalline can be adjusted, for example, by controlling the plasma energy and the duration of the plasma treatment. The re-deposited semiconductor material, which will form the semiconductor layer 120, can also be doped with the low-energy particles. In this case, FIG. 1B illustrates the semiconductor body after treatment with low-energy particles.

Subsequently, as described above, the re-deposited material is subjected to a thermal anneal to initiate re-crystallisation. Annealing can include a furnace anneal as described above.

The second monocrystalline semiconductor portion can also be formed by bonding. This is described next in connection with FIGS. 4A to 4D and 5A to 5D. According to an embodiment, a first monocrystalline semiconductor wafer 210 having a first lattice constant in a reference direction and a second monocrystalline semiconductor wafer 220' having a second lattice constant in the reference direction, which is different to the first lattice constant, are provided. The first monocrystalline semiconductor wafer 210 has a first surface 211 and a second surface 212 opposite to the first surface 211. The second monocrystalline semiconductor wafer 220' has a first surface 221 and a second surface 222 opposite the first surface 221.

Figure 4A:
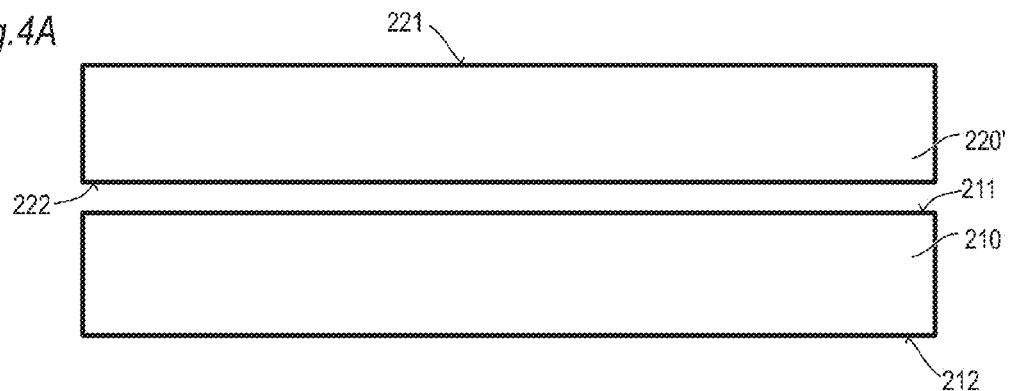
FIGS. 4A to 4D illustrate processes of a method for manufacturing a semiconductor structure having a controlled spike formation between a semiconductor body and a metal layer according to an embodiment.
Figure 4B:
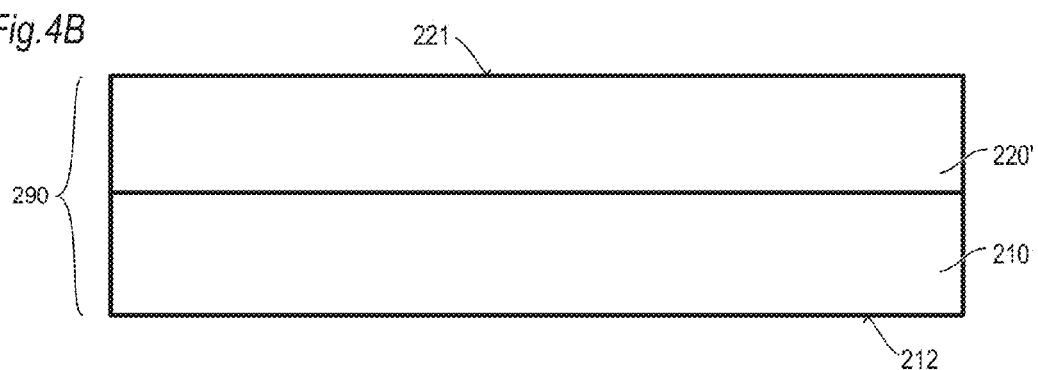
Figure 4C:
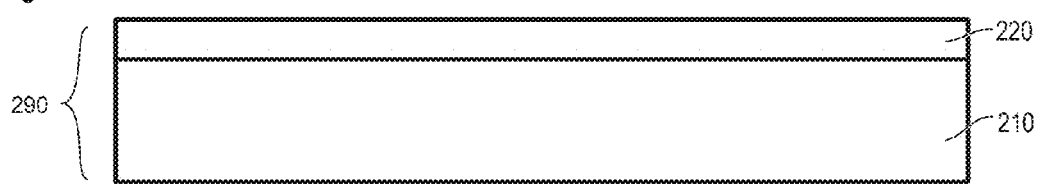
Figure 4D:
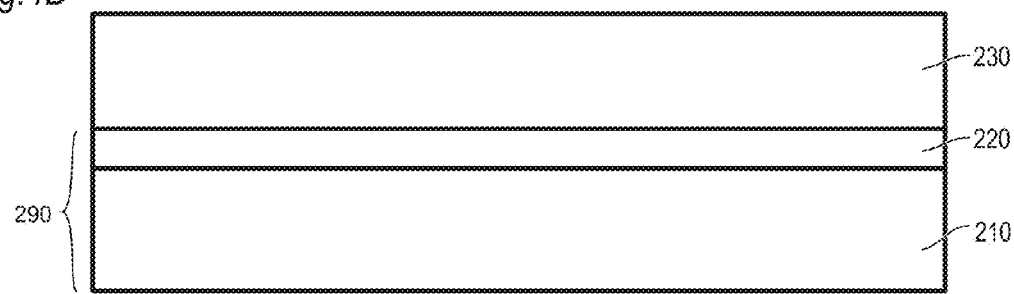

As illustrated in FIGS. 4B to 4D, the first monocrystalline semiconductor wafer 210 is bonded at its first surface 211 to the second surface 222 of the second monocrystalline semiconductor wafer 220' to form a semiconductor body 290 having a first monocrystalline semiconductor portion 210, which is formed by the first monocrystalline semiconductor wafer 210 and has the first lattice constant in the reference direction, and a second monocrystalline semiconductor portion 220, which is formed by the second monocrystalline semiconductor wafer 220' and has the second lattice constant in the reference direction. To this end, first and second monocrystalline semiconductor wafers 210, 220' are provided with the respective lattice orientation. The first monocrystalline semiconductor wafer 210 can be provided with a <100> orientation and the second monocrystalline semiconductor wafer 220' can be provided with a <111> orientation. After bonding, the semiconductor body 290 includes a first surface 221 and a second surface 212.

The bonded second monocrystalline semiconductor wafer 220' can be optionally processed at its first surface 221, for example by polishing, grinding, or chemical-mechanical polishing, to reduce the thickness of the bonded second monocrystalline semiconductor wafer 220' and to obtain a thin second monocrystalline semiconductor portion 220 as illustrated in FIG. 4C.

A metal layer 230 is formed on and in contact with the second monocrystalline semiconductor portion 220 followed by an optional thermal anneal as illustrated in FIG. 4D. The metal layer 230 can be, for example, comprised of aluminium or aluminium alloy and can be deposited using sputtering or chemical vapour deposition. FIG. 4D illustrates a semiconductor structure having a controlled spike formation with reduced depth of the spikes at the interface between the metal layer 230 and the second monocrystalline semiconductor portion 220 as described above.

According to another embodiment, the second monocrystalline semiconductor wafer 220' is not processed by grinding or the like after bonding, but subjected to a cutting process as described below in connection with FIGS. 5A to 5D. The second monocrystalline semiconductor wafer 220' is subjected to an implantation step. For example, gas ions such as protons are implanted into the second surface 222 of the second monocrystalline semiconductor wafer 220' into a given depth. The implantation depth can be adjusted by selecting the implantation energy. The implantation depth defines the thickness of the second monocrystalline semiconductor portion 220 as described further below.

The implantation of gas atoms or gas ions (e.g. protons), respectively, causes the formation of a delamination layer 225 which can be a micro-bubble layer or micro-porous layer along which the second monocrystalline semiconductor wafer 220' is delaminated by a later process. The delamination layer interface is indicated by a dotted line in FIG. 5A.

An optional bonding layer can be formed either on the second surface 222 of the second monocrystalline semiconductor wafer 220' or on the first surface 211 of the first monocrystalline semiconductor wafer 210. The bonding layer can be, for example, comprised of polysilicon. However, the bonding layer is not needed. Optional bonding layer or layers can be formed before or after the implantation of the gas atoms or gas ions.

Subsequently, the first monocrystalline semiconductor wafer 210 is bonded with its first surface 211 to the second surface 222 of the second monocrystalline semiconductor wafer 220' as described above to form a semiconductor body 290.

As illustrated in FIG. 5C, semiconductor body 290 is subjected to a thermal treatment to delaminate the second monocrystalline semiconductor wafer 220' along the delamination layer interface of the delamination layer 225 which serves as a cleavage plane. The thermal treatment causes mechanical tensions which results in a separation along the delamination layer interface. A comparably thin second monocrystalline semiconductor portion 220 corresponding to the delamination layer 225 remains bonded to the first monocrystalline semiconductor wafer 210. The thin second monocrystalline semiconductor portion 220 has a thickness which was defined by the implantation energy of the gas ions in the above described implantation process. The thin second monocrystalline semiconductor portion 220 can be subjected to a polishing process. The desired thickness, for example in the range from 0.5 µm to 5 µm can be precisely controlled by implantation.

The delamination process leads to the formation of a part-wafer 226 which can be used again for manufacturing further semiconductor bodies. This is very cost-efficient. The part-wafer 226 can be polished before reuse. Subsequently, the metal layer 230 is formed on the thin second monocrystalline semiconductor portion 220.

The above described embodiments of FIGS. 4 and 5 are particularly suitable for semiconductor wafers comprised of silicon.

Figure 6:
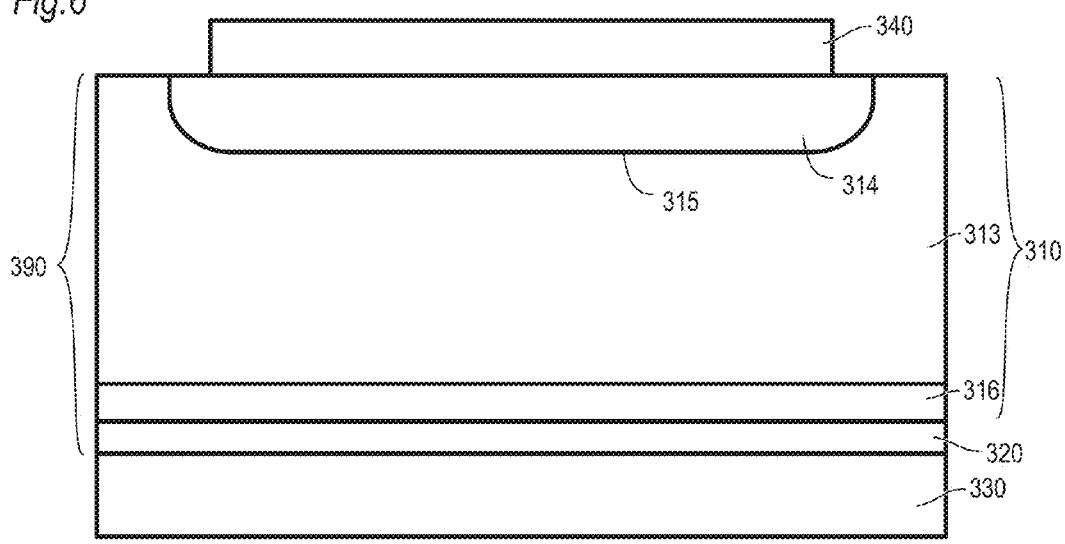
FIG. 6 illustrates a bipolar semiconductor device with reduced spike formation between the semiconductor body and the metallisation according to an embodiment.

With reference to FIG. 6, a semiconductor device according to an embodiment is described. The semiconductor device, which is a bipolar device embodied as power diode, includes a semiconductor body 390 having a first monocrystalline semiconductor portion 310 of a first lattice constant, for example a <100> silicon material, and a second monocrystalline semiconductor portion 320 of a second lattice constant different to the first lattice constant, for example a <111> silicon material. The first monocrystalline semiconductor portion 310 comprises a first doping region 316 of a first conductivity type, which is n-type in this embodiment, and a second doping region 314 of a second conductivity type, which is p-type in this embodiment. The second monocrystalline semiconductor portion 320 forms a doping region of the first conductivity type. The first doping region 316 of the first monocrystalline semiconductor portion 310 is in direct contact with the second monocrystalline semiconductor portion 320 having the same conductivity type as the first doping region 316.

The first doping region 316 forms a cathode region and the second doping region 314 forms an anode region. At least one pn-junction 315 is formed between the anode region 314 and the cathode region 316, particularly between the anode region 314 and a drift region 313 of the first conductivity type. The drift region 313 has a lower doping concentration than the cathode region 316. A metal layer 330 forming a cathode metallization is formed on and in low-ohmic contact with the second monocrystalline semiconductor portion 320. A metal layer 340 forming an anode metallization is formed on and in low-ohmic contact with anode region 314.

Figure 7:
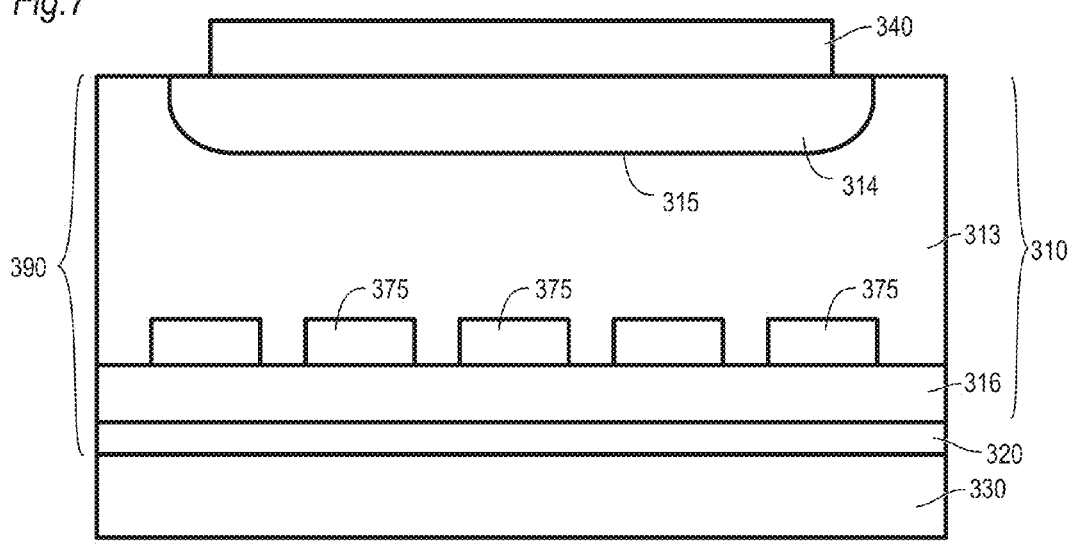
FIG. 7 illustrates a bipolar semiconductor device with reduced spike formation between the semiconductor body and the metallisation according to another embodiment.

As illustrated in FIG. 7 showing another embodiment, the power diode can include buried doping regions 375 of the second conductivity type, i.e. of p-type in this embodiment, which are formed within the drift region 313 and close to the cathode region 316. The buried doping regions 375 are completely surrounded by regions of opposite conductivity type and spaced apart from the second monocrystalline semiconductor portion 320. However, since the second monocrystalline semiconductor portion 320 prevents formation of deep spikes as described above, the buried doping regions 375 can be formed in close proximity to the second monocrystalline semiconductor portion 320.

A further embodiment of a semiconductor device is illustrated in FIG. 8. The semiconductor device, which is a bipolar device embodied as an IGBT, includes a semiconductor body 490 having a first monocrystalline semiconductor portion 410 of a first lattice constant, for example a <100> silicon material, and a second monocrystalline semiconductor portion 420 of a second lattice constant different to the first lattice constant, for example a <111> silicon material. The first monocrystalline semiconductor portion 410 comprises a first doping region 416 of a second conductivity type, which is p-type in this embodiment, and a second doping region 414 of the second conductivity type. The second monocrystalline semiconductor portion 420 forms a doping region of the second conductivity type in this embodiment. The first doping region 416 of the first monocrystalline semiconductor portion 410 is in direct contact with the second monocrystalline semiconductor portion 420 having the same conductivity type as the first doping region 416.

The first doping region 416 of the first monocrystalline semiconductor portion 410 forms here an emitter region 416 while the second doping region 414 forms a body region 414 of the IGBT. A drift region 413 of the first conductivity type, i.e. n-type in this embodiment, is formed within the first monocrystalline semiconductor portion 410 and between the body region 414 and the emitter region 416. Source regions 417 of the first conductivity type are embedded into the body regions 414. A pn-junction 415 is formed between the body region 414 and the drift region 413. A further pn-junction is formed between the body region 414 and the source region 417. Between the drift region 413 and the emitter region 416 there is formed a field stop layer 470 of the first conductivity type (n-type in this embodiment). Furthermore, buried doping regions 475 of the second conductivity type are embedded in the field stop layer 470. The field stop layer 470 layer has a higher doping concentration than the drift region 413.

The second monocrystalline semiconductor portion 420 prevents formation of deep spikes from the metal layer 430 into the semiconductor body 490 without reaching the first monocrystalline semiconductor portion 410. This allows formation of a homogeneous ohmic contact between the metal layer 430 and the semiconductor body 490, particularly to the emitter region 416.

A gate electrode 441 is formed on a gate dielectric 442 disposed on an upper surface of the semiconductor body 490. A further metal layer 440 is formed on and in ohmic contact with the body region 414 and the source region 417.

Hence, the semiconductor device includes a source region 417 of a first conductivity type, a body region 414 of a second conductivity type in contact with the source region 417, a drift region 413 of the first conductivity type in contact with the body region 414, and an emitter region 416 of the second conductivity type, wherein the second monocrystalline semiconductor portion 420 is in direct contact with the emitter region 416 and has the same conductivity type as the emitter region 416.

FIG. 8 also illustrates a unipolar device such as a power MOSFET. In this case, first doping region 416 is of the first conductivity type (n-type in this embodiment) and forms a drain region of the MOSFET. The second monocrystalline semiconductor portion 420 is then also of the first conductivity type. Hence, the semiconductor device includes at least a source region 417 of a first conductivity type, a body region 414 of a second conductivity type in contact with the source region 417, a drift region 413 of the first conductivity type in contact with the body region 414, and a drain region 416 of the first conductivity type, wherein the second monocrystalline semiconductor portion 420 is in direct contact with the drain region 416 and has the same conductivity type as the drain region 416.

The above embodiments are particularly suitable for power devices which typically include a plurality of cells which have an identical arrangement, which are integrated into the same semiconductor body, and which are electrically connected in parallel to allow control of high currents.

The embodiments described herein include a semiconductor structure having a second monocrystalline semiconductor portion formed between a first monocrystalline semiconductor portion and a metal layer, wherein the first and second monocrystalline semiconductor portions are of different lattice orientation. This semiconductor structure forms homogeneously deep spikes when subjected to a thermal anneal of sufficiently high temperature which allows formation of reproducible electrical contacts between the metal layer and the second monocrystalline semiconductor portion. Furthermore, the risk of an unwanted enhanced growth of the spikes into the depth of the second monocrystalline semiconductor portion or the first monocrystalline semiconductor portion is reduced. Formation of unwanted through contacts to buried doping regions or extended depletion zones of pn-junctions during revers mode of a semiconductor device can thus be limited or even completely avoided.

The homogeneous depth of the spikes over the contact area between the metal layer and the second monocrystalline semiconductor portion contributes to a laterally homogeneous voltage drop which is beneficial particularly for power devices. In particular, the depth of the spikes can be reproducibly controlled so that buried doping regions, for example as illustrated in FIGS. 7 and 8, can be integrated without having to form such buried doping regions in a great depth. Furthermore, the "rounding" of the current characteristics of the devices can be significantly reduced since such "rounding" is caused by the thermomigration-induced growth of spikes, which is restrained by the approach described herein.

The quality of the above described contact structure can be investigated, for example, by SEM or other analysis tools used in crystal analysis.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor structure, comprising:
a first monocrystalline semiconductor portion having a first lattice constant in a reference direction;
a second monocrystalline semiconductor portion having a second lattice constant in the reference direction, which is different to the first lattice constant, on the first monocrystalline semiconductor portion; and
a metal layer formed on and in contact with the second monocrystalline semiconductor portion, wherein the first monocrystalline semiconductor portion and the second monocrystalline semiconductor portion are made of Si, and wherein the first monocrystalline semiconductor portion has a <100> lattice orientation in the reference direction and the second monocrystalline semiconductor portion has a <111> lattice orientation in the reference direction.

2. The semiconductor structure of claim 1, wherein the first monocrystalline semiconductor portion and the second monocrystalline semiconductor portion are made of the same semiconductor material.

3. The semiconductor structure of claim 1, wherein the metal layer comprises at least one of a single metal layer and a metal alloy layer.

4. The semiconductor structure of claim 1, wherein the metal layer comprises at least aluminium or an aluminium alloy.

5. The semiconductor structure of claim 1, wherein the second monocrystalline semiconductor portion has a thickness between about 0.5 µm and about 5 µm.

6. The semiconductor structure of claim 1, wherein the second monocrystalline semiconductor portion is in direct contact with the first monocrystalline semiconductor portion.

7. A semiconductor device, comprising:
a semiconductor body comprising:
a first monocrystalline semiconductor portion having a first lattice constant in a reference direction;
a second monocrystalline semiconductor portion having a second lattice constant in the reference direction, which is different to the first lattice constant, on the first monocrystalline semiconductor portion;
at least one pn-junction formed in the first monocrystalline semiconductor portion;
and
a metal layer formed on and in ohmic contact with the second monocrystalline semiconductor portion,
wherein the semiconductor device is a bipolar device comprising a cathode region of a first conductivity type and an anode region of a second conductivity type,
wherein the at least one pn-junction is formed between the anode region and the cathode region,
wherein the second monocrystalline semiconductor portion is in direct contact with the cathode region and has the same conductivity type as the cathode region.

8. The semiconductor device of claim 7, wherein the first monocrystalline semiconductor portion comprises a first doping region of a first conductivity type and a second doping region of a second conductivity type, and the second monocrystalline semiconductor portion has a doping region of the first conductivity type, wherein the first doping region of the first monocrystalline semiconductor portion is in direct contact with the doping region of the second monocrystalline semiconductor portion.

9. A bipolar semiconductor device, comprising:
a semiconductor body comprising:
a first monocrystalline semiconductor portion having a first lattice constant in a reference direction;
a second monocrystalline semiconductor portion having a second lattice constant in the reference direction, which is different to the first lattice constant, on the first monocrystalline semiconductor portion;
at least one pn-junction formed in the first monocrystalline semiconductor portion;
a metal layer formed on and in ohmic contact with the second monocrystalline semiconductor portion;
a source region of a first conductivity type;
a body region of a second conductivity type in contact with the source region;
a drift region of the first conductivity type in contact with the body region; and an emitter region of the second conductivity type,
wherein the second monocrystalline semiconductor portion is in direct contact with the emitter region and has the same conductivity type as the emitter region.

10. A unipolar semiconductor device, comprising:
a semiconductor body comprising:
   a first monocrystalline semiconductor portion having a first lattice constant in a reference direction;
   a second monocrystalline semiconductor portion having a second lattice constant in the reference direction, which is different to the first lattice constant, on the first monocrystalline semiconductor portion;
   at least one pn-junction formed in the first monocrystalline semiconductor portion;
a metal layer formed on and in ohmic contact with the second monocrystalline semiconductor portion;
a source region of a first conductivity type;
a body region of a second conductivity type in contact with the source region;
a drift region of the first conductivity type in contact with the body region; and
a drain region of the first conductivity type,
wherein the second monocrystalline semiconductor portion is in direct contact with the drain region and has the same conductivity type as the drain region.

* * * * *